(12) United States Patent
Wilczynski

(10) Patent No.: US 9,135,548 B2
(45) Date of Patent: Sep. 15, 2015

(54) PORTABLE MECHANICAL SWITCH FOR SELECTIVE DEACTIVATION OF RADIO FREQUENCY IDENTIFICATION CIRCUITS

(71) Applicant: eBay Inc., San Jose, CA (US)

(72) Inventor: Matthew Wilczynski, Austin, TX (US)

(73) Assignee: PAYPAL, INC., San Jose, CA (US)

( * ) Notice: Subject to any disclaimer, the term of this patent is extended or adjusted under 35 U.S.C. 154(b) by 342 days.

(21) Appl. No.: 13/689,432

(22) Filed: Nov. 29, 2012

(65) Prior Publication Data

US 2014/0146510 A1  May 29, 2014

(51) Int. Cl.
  *G06K 19/073*  (2006.01)
  *G07C 9/00*  (2006.01)

(52) U.S. Cl.
  CPC ...... *G06K 19/07327* (2013.01); *G07C 9/00111* (2013.01)

(58) Field of Classification Search
  CPC .................. G06K 19/07327; G07C 9/00111
  USPC .......... 361/816–818; 340/2.1–14.69; 235/492
  See application file for complete search history.

(56) References Cited

U.S. PATENT DOCUMENTS

| | | | |
|---|---|---|---|
| 4,647,714 A * | 3/1987 | Goto | 174/36 |
| 6,155,410 A * | 12/2000 | Davis | 206/39.5 |
| 6,845,863 B1 * | 1/2005 | Riley | 206/39 |
| 7,830,672 B1 * | 11/2010 | Kitchen | 361/818 |
| 8,004,414 B2 * | 8/2011 | Angell et al. | 340/606 |
| 8,419,889 B2 * | 4/2013 | Smith | 156/307.5 |
| 8,841,987 B1 * | 9/2014 | Stanfield et al. | 340/5.61 |
| 2004/0100359 A1 * | 5/2004 | Reade et al. | 340/5.2 |
| 2004/0148837 A1 * | 8/2004 | Lewis | 40/654.01 |
| 2005/0183579 A1 * | 8/2005 | Bowers | 99/279 |
| 2006/0027593 A1 * | 2/2006 | Slocum | 221/232 |
| 2006/0044109 A1 * | 3/2006 | Griffits et al. | 340/5.65 |
| 2006/0124747 A1 * | 6/2006 | Rathbun et al. | 235/486 |
| 2007/0115127 A1 * | 5/2007 | Harper et al. | 340/572.1 |
| 2007/0157494 A1 * | 7/2007 | Barcikowski | 40/1.5 |
| 2007/0164866 A1 * | 7/2007 | Robin et al. | 340/572.7 |
| 2007/0289775 A1 * | 12/2007 | Potts et al. | 174/350 |
| 2008/0000987 A1 * | 1/2008 | Augustinowicz et al. | 235/492 |
| 2008/0055046 A1 * | 3/2008 | Shimizu | 340/10.1 |
| 2008/0083829 A1 * | 4/2008 | Lowe | 235/486 |
| 2008/0190526 A1 * | 8/2008 | O'Shea | 150/147 |
| 2008/0279959 A1 * | 11/2008 | Holmes | 424/618 |
| 2010/0014270 A1 * | 1/2010 | Liu | 361/818 |
| 2010/0230309 A1 * | 9/2010 | Kiyozuka | 206/320 |
| 2010/0231353 A1 * | 9/2010 | Haberli | 340/5.8 |
| 2010/0271187 A1 * | 10/2010 | Uysal et al. | 340/10.4 |

(Continued)

*Primary Examiner* — David M Sinclair
*Assistant Examiner* — Robert Brown
(74) *Attorney, Agent, or Firm* — Haynes and Boone, LLP

(57) ABSTRACT

Systems and methods for providing security for authentication devices—such as electronically readable cards or ID badges with embedded RFID chips or NFC capability—may include an envelope or pocket-like case for carrying an electronically readable card, having an electrically conductive, non-opaque sleeve that can be moved to cover or expose the electronically readable card and that prevents information on the card from being electronically read when covered yet still allows the card to be seen when covered. In one or more embodiments, the sleeve may be a wire mesh that is flexible enough to be compressed to expose the card yet stiff (or rigid) enough to be extended to cover the card and that is transparent enough to allow reading visual information on the surface of the card when covering the card. Protection can be switched off by a mechanical switch that leaves the protection normally on.

20 Claims, 5 Drawing Sheets

(56) References Cited

U.S. PATENT DOCUMENTS

2011/0062242 A1* 3/2011 Cowcher ................. 235/492
2012/0156992 A1* 6/2012 Walker et al. ........... 455/41.1
2012/0309307 A1* 12/2012 D'Amico ................. 455/41.1
2013/0000801 A1* 1/2013 Lee et al. ................. 150/147
2013/0037615 A1* 2/2013 Powell et al. ............ 235/492
2013/0271265 A1* 10/2013 Finn ......................... 340/10.1
2013/0307687 A1* 11/2013 Kay ...................... 340/539.13
2014/0118116 A1* 5/2014 Lavedas ................... 340/10.3

* cited by examiner

PORTABLE MECHANICAL SWITCH FOR SELECTIVE DEACTIVATION OF RADIO FREQUENCY IDENTIFICATION CIRCUITS

BACKGROUND

1. Technical Field

Embodiments of the present invention generally relate to security for radio frequency identification (RFID) and, more particularly, to protecting cards having embedded RFID radio frequency for which the protection can be conveniently deactivated yet allows the card to remain visible even while protected.

2. Related Art

Radio frequency identification (RFID) chips, which can be remotely activated to wirelessly transmit information from the chip, are widely used in many types of authentication devices, including, for example, credit cards, passports, and identity badges, in which a tiny RFID chip may be embedded. Information contained in an RFID chip is, however, often insecure for a number of reasons. For example, the information may not be encrypted due to encryption being expensive for manufacturers; attackers may be able to remotely identify, read, and copy the information stored on an RFID chip using an RFID skimmer that electronically reads and copies the information; and the equipment necessary to skim an RFID authentication device may be obtainable at relatively low cost.

Currently, owners of RFID badges, RFID-embedded credit cards such as payWave™ or PayPass™ credit cards, and other authentication devices using RFID or near field communication (NFC), for example, may sometimes use pouch-like enclosures impregnated with metals to guard against surreptitious duplication or sabotage of their credentials. Such enclosures may take the form of homemade wallets consisting of tinfoil and duct tape, for example, or more sturdy products made with nylon and steel. While these enclosures can be quite effective, they are often cumbersome and require the user to fully remove and then replace the credential device. This type of protection is also unsuitable for credentials—such as identification badges—that must be worn and displayed visibly even when not being used for electronic authentication.

Figure 1:
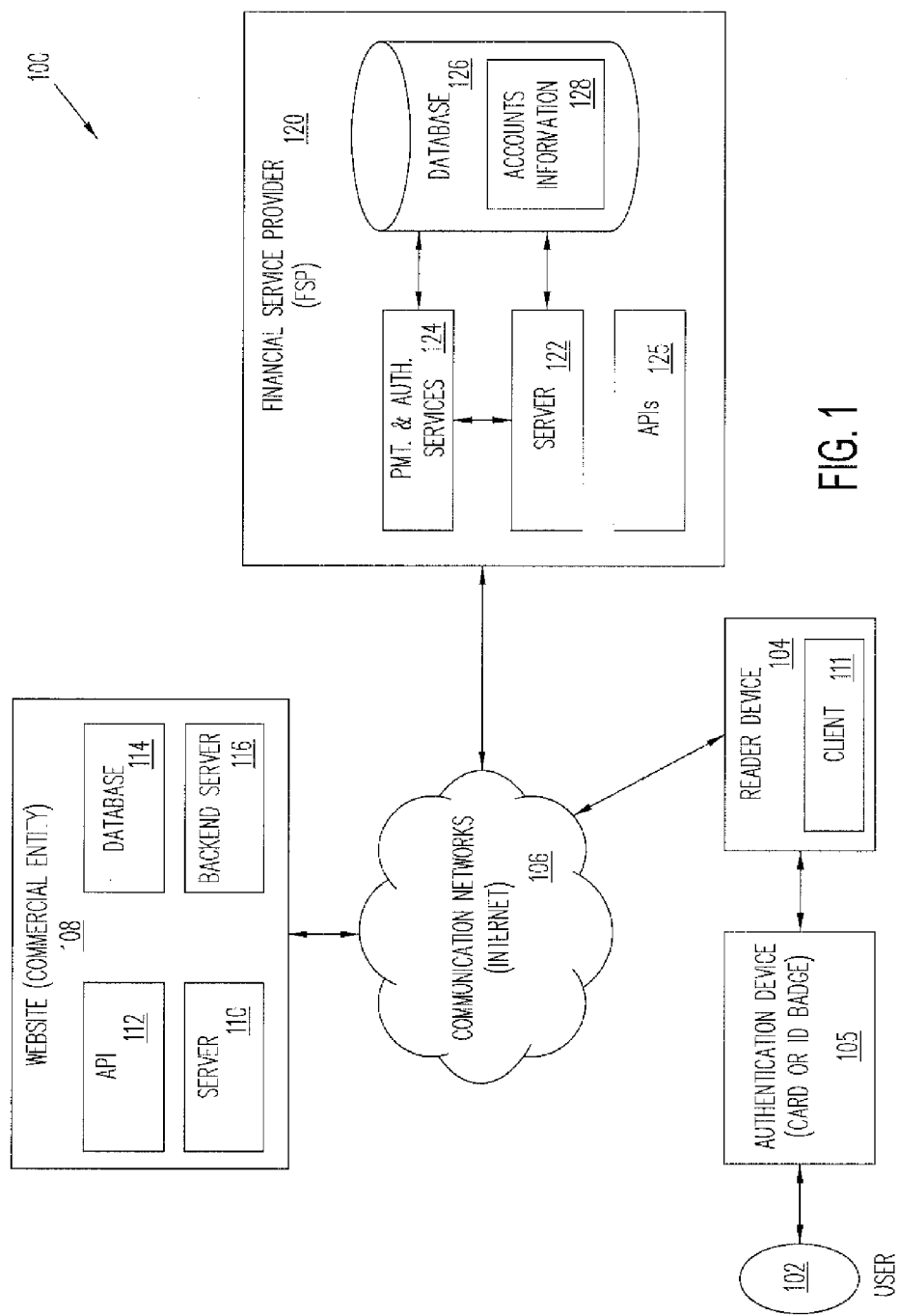
FIG. 1 is a system block diagram illustrating a system in accordance with one or more embodiments of the present invention.

Embodiments of the present disclosure and their advantages are best understood by referring to the detailed description that follows. It should be appreciated that like reference numerals are used to identify like elements illustrated in one or more of the figures, in which the showings therein are for purposes of illustrating the embodiments and not for purposes of limiting them.

DETAILED DESCRIPTION

Broadly speaking, methods and systems are provided in one or more embodiments for providing security for cards and authentication devices having embedded radio frequency identification (RFID) in which the authentication device (e.g., a credit card or identification (ID) badge) is protected from being read electronically while still being visible (e.g., visually readable, such as a photo ID badge) and the protection can be conveniently deactivated by a user, allowing the authentication device or card to be read electronically.

Items with embedded radio frequency identification (RFID) or near-field communication (NFC) chips often lack a means to easily disable transceiver components when they are not needed or during times when their operation would constitute a security risk. For example, RFID-enabled bank credit cards have been the object of some concern because of the readiness with which criminals can "clone" or "skim" them using modified readers similar to those of legitimate merchants and getting near enough to a credit card to coax its response signals. In addition, the vulnerability of RFID circuits to directed electromagnetic radiation could, for example, enable a skilled social engineer to permanently deactivate an unsuspecting employee's ID badge from a distance and then exploit a power relationship (e.g., posing as a security guard or "helpful" information technology (IT) specialist) to con the employee into revealing other identity information.

Embodiments may address such scenarios, improving ID badge security by guarding against surreptitious duplication and chip destruction while at the same time preserving other functionality of the card or badge such as visibility of a photo identification affixed to an ID badge. The selective RFID deactivation system that allows the read-protection to be deactivated upon a user's selection of a switch position may allow users to travel freely and securely in the knowledge that, until the user pushes down the deactivation switch, the user's badge is non-readable electronically (while remaining visually readable). As a consequence, an ID badge protected by one embodiment can compensate for unforeseen circumstances, for example, a lack of cautiousness on the part of a user—protecting the user in situations where the user might otherwise inadvertently or guilelessly expose the ID badge to unauthorized electronic reading outside of a secure work environment.

In one embodiment, for example, a carrying case-like apparatus may allow a user to place an RFID-embedded badge, credit card, or other chip-embedded item (generally referred to as electronically readable authentication device or card) inside the case and selectively enable or disable reading of the card by simply pressing down on a switch (e.g., button, lever, or slider). Activation and deactivation of electronic read-protection for the item may be achieved, in one or more embodiments, by way of a flexible, electrically conductive mesh or sheath that runs along a channel between layers of protective plastic in the case. The mesh may be compressed (moving the mesh to electronically expose the item, allowing the item to be electronically read) whenever the user presses the switch. The mesh or sheath, when uncompressed, may act according to the physical principles of a Faraday cage, preventing the electronically readable card from being accessed or read electronically, by surrounding or enclosing the item and obscuring the item from electric fields and electromagnetic radiation. The mesh or sheath, however, may be virtually transparent or at least semi-transparent so that the item remains visible and information on the item—such as an ID photo and text information—can still be seen or read optically. Embodiments may differ from other products for protecting electronically readable cards that are more similar to a conventional wallet and completely cover the chip-embedded card so that it is not visible. Faraday cages are typically rigid rather than flexible, requiring a door-like opening, or flap, to be opened to move objects into and out of the cage.

In one or more embodiments, systems and methods provide an envelope or pocket-like case for carrying an electronically readable card, having an electrically conductive, non-opaque sheath that can be moved to cover or expose the electronically readable card and that prevents information on the card from being electronically read when covered yet still allows the card to be seen, e.g., preserving visual functionality, when covered. In one or more embodiments, the sheath may be a wire mesh that is flexible enough to be compressed to expose the card yet stiff (or rigid) enough to be extended to cover the card and that is transparent enough to allow reading visual information on the surface of the card when covering the card.

For example, according to one embodiment, a system may include: a case having an opening for inserting an authentication device and an inside shaped to accept the authentication device, in which the case allows the authentication device to remain visible when the authentication device is inside the case; and a flexible, electrically conductive sheath inside the case, the sheath having a first position and a second position, and readily moveable between the two positions, such that: in the first position, when the authentication device is inside the case, the electrically conductive sheath encloses the authentication device and the authentication device remains visible through the sheath; and in the second position, the sheath does not enclose the authentication device.

Also, according to one embodiment, a method may include: protecting an electronically readable card from being electronically read while maintaining visual readability of the electronically readable card; mechanically switching off a protection of the electronically readable card for presentation to an electronic card reader; and mechanically switching the protection back on so that the electronically readable card is protected from being electronically read yet is still visually readable.

FIG. 1 illustrates a system 100 that may employ methods and devices for improving security of an authentication device 105, in accordance with one or more embodiments. A user 102 (e.g., a consumer using an electronically readable credit card or employee carrying or wearing an ID badge) may present an authentication device 105 (e.g., an RFID-embedded badge, credit card, or other chip-embedded or NFC enabled item) to a reader device 104. Reader device 104 may electronically read information from authentication device 105 according to the technology involved, e.g., RFID or NFC. Reader device 104 may include a computing device (e.g., a computer, cell phone, POS terminal, or other electronic device) configured to communicate over a communication network 106, which may be implemented as a single network or a combination of multiple networks. For example, network 106 may include the Internet as well as phone networks such as Public Switched Telephone Network (PSTN) or one or more intranets, landline networks, wireless networks, or other appropriate types of networks.

Reader device 104 may communicate via network 106 with a website 108 that may be operated by a commercial entity, such as a security service or a merchant website that is a seller of retail goods, for example. For example, website 108 may be a merchant website, may sell goods online, and may communicate with reader device 104 (e.g., a POS terminal) by operating a server 110 (e.g., a computer processor) that presents a website for selling goods. The server 110 may respond to client devices (e.g., client 111 running on reader device 104) by communicating over network 106. Website 108 may also maintain a database 114 and provide user accounts for its customers. Database 114 may provide convenience for customers of the merchant (e.g., merchant website 108) by allowing, for example, users to keep their shipping information on file with the merchant so as not to have to re-enter information with every order, or, for example, the merchant may like to offer promotions for users with an account on merchant website 108. Merchant website 108 may operate a backend server 116 that is limited in its communications over network 106 and may communicate with server 110 and database 114 through a firewall for providing more secure operations than would be possible with server 110. In another example, website 108 may provide a security service that, for example, tracks authentication devices 105 (e.g., authentication device 105 may be an employee ID badge).

Website 108 may also communicate (for example, using server 110) with a financial service provider (FSP) 120 through FSP server 122 over network 106. For example, website 108 may communicate with FSP 120 in the course of various services offered by FSP 120 to website 108, such as payment intermediary between customers (e.g., consumer user 102 of merchant website 108) and merchant website 108 itself. For example, merchant website 108 may use an application programming interface (API) 112 that allows it to run apps and offer sale of goods in which customers are allowed to make payment through FSP 120, while consumer user 102 may have an account with FSP 120 that allows consumer user 102 to use the FSP 120 for making payments to sellers that allow use of authentication, authorization, and payment services 124 of FSP 120 as a payment intermediary. Financial service provider services may also include, for example, an online payment service operating between consumers and merchants and may also be a service provided by a financial service provider (FSP)—such as PayPal, Inc. of San Jose, Calif.—in which a user of the service may have an account with the FSP (referred to as an "FSP account"). Also as shown in FIG. 1, FSP 120 may provide electronic data storage in the form of database 126. Database 126 may be used to keep track of user's accounts 128 with FSP 120, merchant's accounts with FSP 120, and transactions between customers, merchants, and stores including payments between the various entities, for example. FSP server 122 may execute various application programming interfaces (APIs) that may enable various different types of relationships between FSP 120 and the different parties shown in FIG. 1. In addition, FSP may provide various APIs 125 to its customers such as website 108 (e.g., API 112) that enable those websites to implement embodiments of authentication, authorization, and password reset services.

Figure 2:
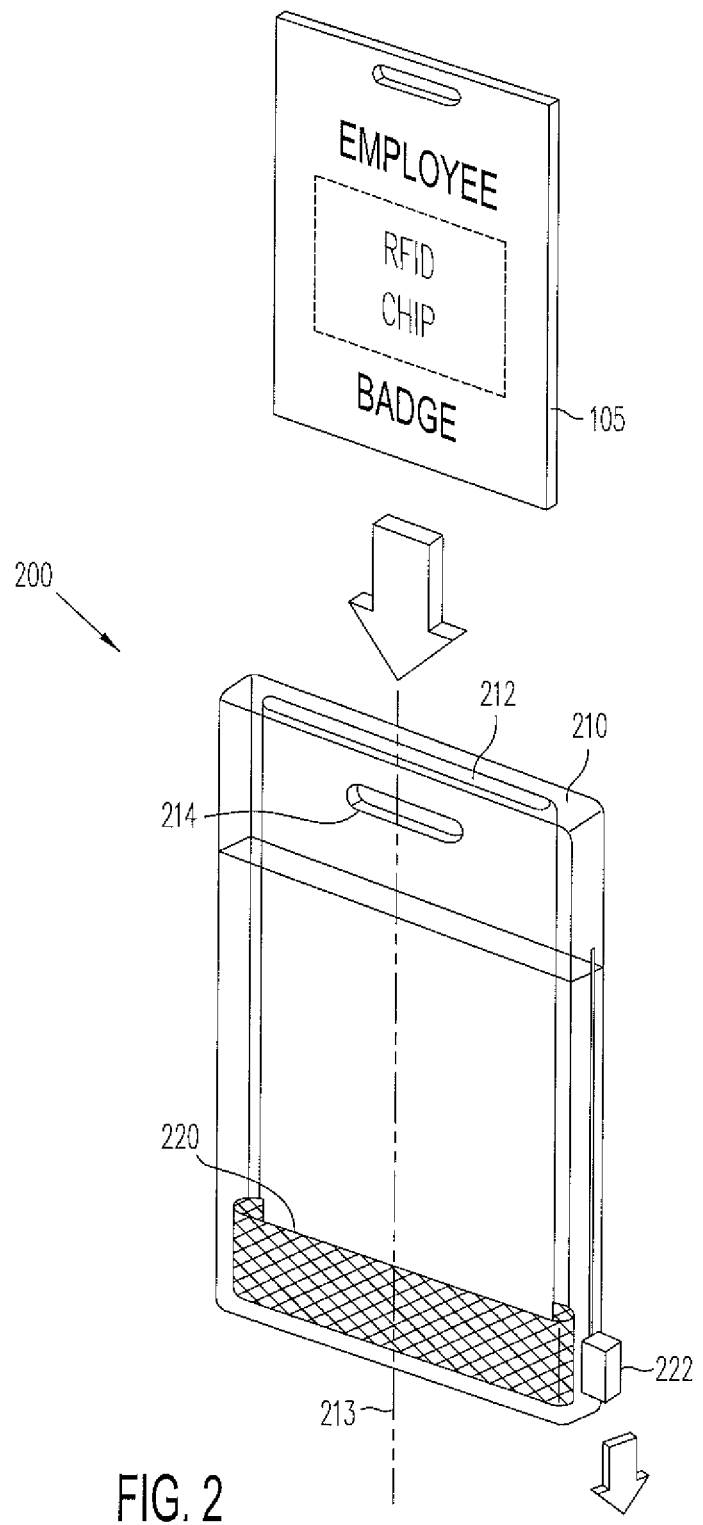
FIG. 2 is a perspective view illustrating an apparatus in accordance with an embodiment.
Figure 3:
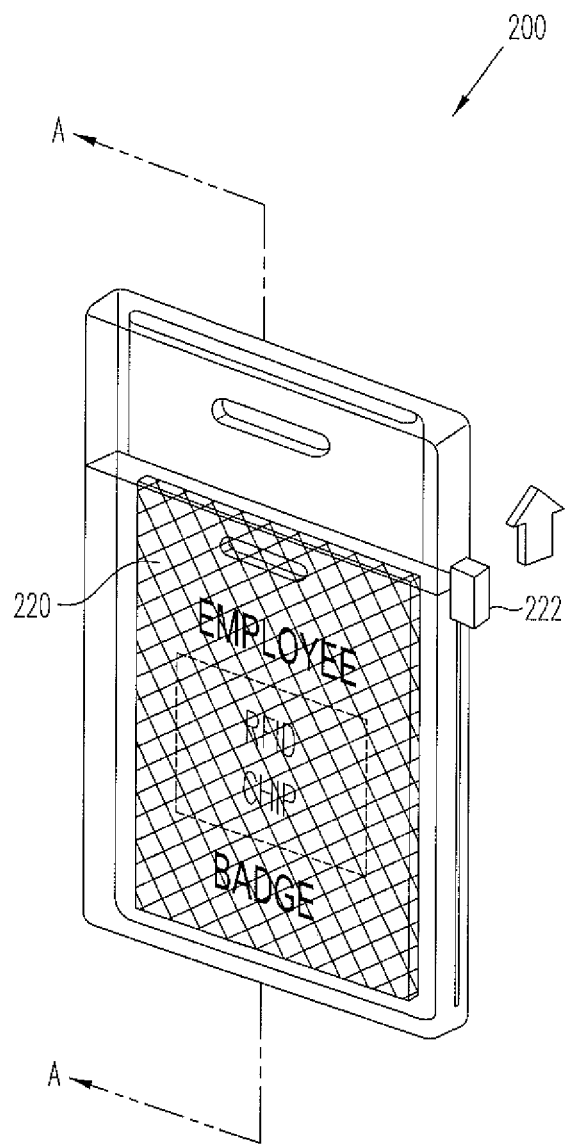
FIG. 3 is a perspective view illustrating an apparatus in accordance with an embodiment.
Figure 4:
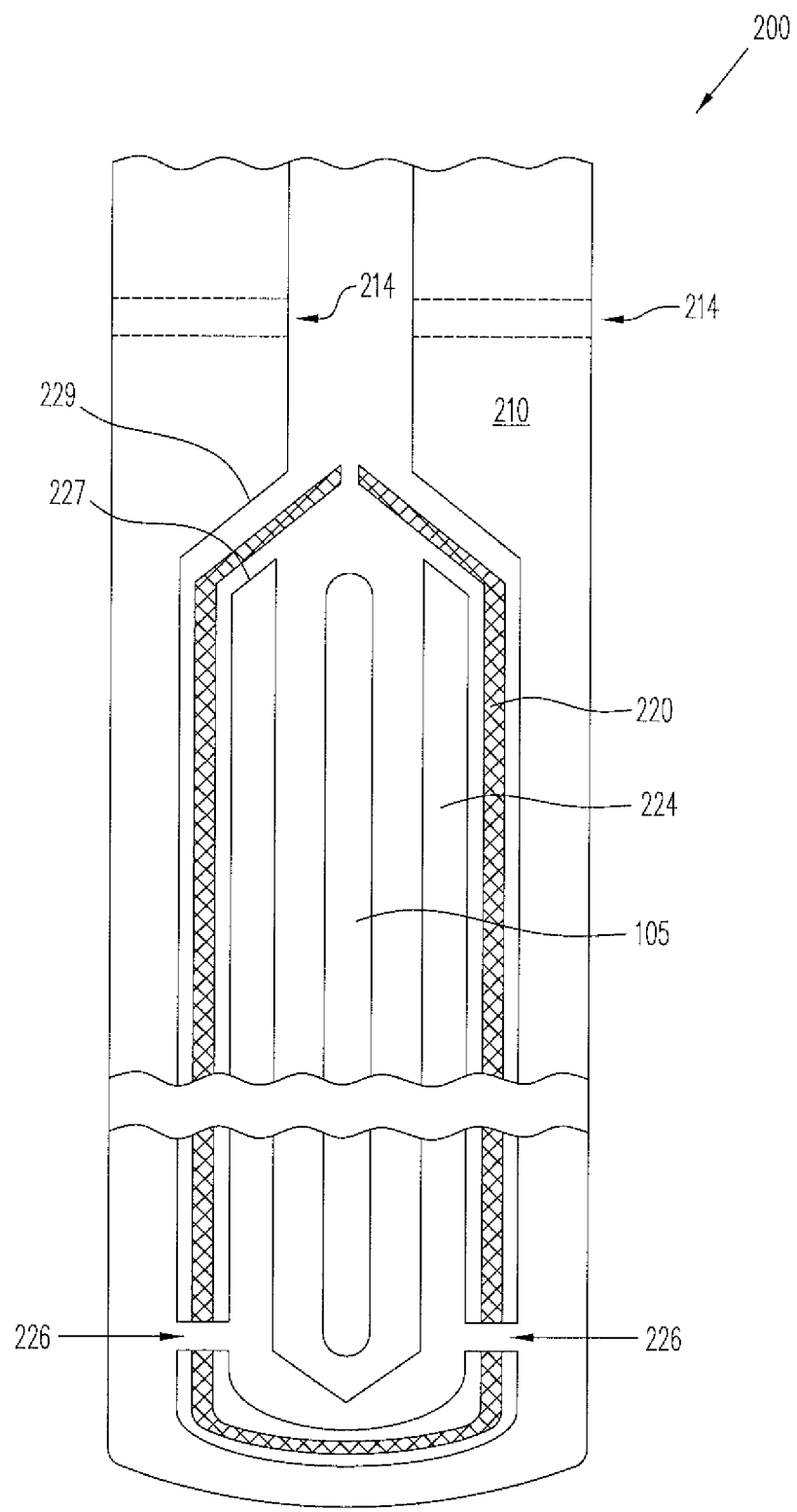
FIG. 4 is a cross sectional view, taken along line A-A of FIG. 3, illustrating an apparatus in accordance with an embodiment.

FIGS. 2, 3, and 4 illustrate a protective device 200, in accordance with an embodiment, that may used for guarding electronic readability of authentication device 105 shown in FIG. 1. Authentication device 105 may be a card with an embedded chip, such as an RFID chip or NFC enabled chip or circuit, for example, referred to as a chip-embedded card. For brevity, authentication device 105 may be referred to as "card 105".

FIG. 2 shows a relatively small (e.g., sized to hold a typical credit card, ID badge, or passport) protective device 200 that may include a case 210 or outer shell that encloses a sheath 220 that is moveable to enclose the card 105, as shown in FIG. 3, when the card 105 is inside the case 210. When in the configuration shown in FIG. 3, sheath 220 may completely enclose card 105 or may enclose card 105 sufficiently to act as a Faraday cage that may protect card 105 from being electronically read by a card reader, such as card reader 104 or some other, possibly surreptitiously placed or used, card reading device.

For example, the size of holes or openings (e.g., any part of the cage's uninterrupted open areas—measured in any dimension or direction) in a Faraday cage may be related to the wavelength of electromagnetic radiation that it is intended for the Faraday cage to block according to a general empirical rule that the size of any opening should be no larger than about 1/10 to 1/20 of the smallest wavelength intended to be blocked. So for example, for the 900 mega-Hertz (MHz) frequency band commonly employed in RFID schemes the wavelength is approximately 33 centimeters (cm), so that a Faraday cage with openings for which the maximum dimension of any opening is no greater than about 1.65 cm (based on 1/20 of a wavelength) should be more than sufficient to provide protection from being electronically read at 900 MHz or less for a card enclosed within the Faraday cage (e.g., a card 105 enclosed within a sheath 220).

As shown in FIG. 2, case 210 may have an opening 212 for inserting card 105 and the opening 212 may determine—by being more or less perpendicular to the opening 212—an axis 213 of case 210, along which card 105 may be inserted into case 210, as indicated by the arrow in FIG. 2. Sheath 220 may be collapsible and expandable axially with reference to axis 213 as can be seen by comparison between FIG. 2 and FIG. 3 of the positions of sheath 220. In a protected, or default, first position, shown in FIG. 3, sheath 220 may enclose and protect card 105 from being electronically read (but still allow information on card 105 to remain visible or capable of being visually read). In an unprotected, or exposed, second position, shown in FIG. 2, sheath 220 may leave enough of card 105 electronically exposed to be electronically readable by a card reading device, such as card reader 104 (as well as still being visible). A button 222—such as a slider, lever, catch, or other mechanism—may be provided for convenient finger operation in moving sheath 220 between its first and second positions.

For example, a mechanism may be so arranged (e.g., using spring tension or elasticity of the sheath 220 material itself) that button 222 needs to be held to maintain sheath 220 in the exposed position shown in FIG. 2 so that sheath 220 automatically returns to the default, protected position shown in FIG. 3 when button 222 is released. In another example, a mechanism may be so arranged that button 222 catches and remains in the last position selected by a user. For added convenience and accessibility, case 210 may further include a hole 214 or other suitable attachment point (e.g., for a clip attachment) for attaching the case 210, for example, to clothing, a lanyard, or a key-ring.

In another example, instead of having a button 222 on the side of the case 210, the entire sheath 220 assembly (including spring tension or compression) may be inverted so that the sheath 220 is compressed only when a lanyard or similar attachment device is pulled. In this example, sheath 220 may be attached to a sliding component of the case 210, so that sheath 220 compresses in an upward direction (with respect to the orientation of the security badge and the wearer) instead of downward (as seen in FIG. 2).

In general, sheath 220 may be regarded as a cylinder with cylindrical axis 213, surrounding card 105. Sheath 220 may also surround an inner sleeve 224 also regarded as generalized cylinder having cylindrical axis 213, as shown in cross section in FIG. 4. Both case 210 and inner sleeve 224 may be made of transparent plastic; case 210 may be made of a harder plastic and inner sleeve 224 may be more flexible. Inner sleeve 224 may be configured so that card 105 may slide into inner sleeve 224 and inner sleeve 224 is surrounded by sheath 220, which is surrounded by case 210, so that a space or channel is formed between inner sleeve 224 and case 210 (also referred to as "outer sleeve") in which sheath 220 may be retained. Both the inner and outer sleeves may be somewhat flexible, but the two sleeves should act in concert as a channel that both guides the movement of sheath 220 and prevents sheath 220 from rubbing against the enclosed ID card or chip (e.g., card 105). To ensure relative stability of the disposition of inner sleeve 224 with respect to outer sleeve (case) 210, inner (224) and outer sleeves (210) may be provided with anchor points 226 (see FIG. 4) at which the inner (224) and outer (210) sleeves are joined through sheath 220, near or at the bottom of sheath 220 so that effectiveness of sheath 220 for electronic readability protection is not compromised (e.g., bottom of sheath 220 is closed sufficiently to provide Faraday cage shielding as described above).

A sufficiently tensile and plastic metal (or other electrically conductive material) may be selected for the sheath 220 so that the edges of the top opening of sheath 220 will close or "snap" together when sheath 220 is moved (e.g., releasing button 222) to the protected or default position, but will separate to allow a card edge (and the top of inner sleeve 224) to pass through when sheath 220 is moved to the unprotected or exposed position (e.g., depressing button 222). To achieve this type of closure for the top of sheath 220, the outside top edges of the inner plastic sleeve 224 may be beveled (see FIG. 4) so that the inner sleeve beveling 227 guides the top edges of sheath 220 away from each other as the sheath 220 slides down the inner sleeve 224. Alternately, or in addition to inner sleeve beveling 227, the inner sides of the outer sleeve may be angled (or beveled) such that outer sleeve beveling 229 drives the top edges of sheath 220 toward each other when the as the sheath 220 slides up the inner sleeve 224, for example, as spring pressure elongates sheath 220 back to the default position upon release of button 222.

Depending on the material and construction of sheath 220, the movability of sheath 220 may be variously described as collapsible-extendable (e.g., for a spring-loaded "scissor gate"-style lattice); compressible-expandable (e.g., for a springy or elastic material such as a mesh); or telescoping (e.g., for segments that can nest inside each other).

The totality of the sheath 220 may elongate and contract axially (e.g., in the direction of axis 213) by any of (or any combination of) the following means, for example: hinged connections inserted in a lattice to create a conventional "scissor gate" lattice; exploiting the plastic or elastic properties of certain metals (such as "shape memory" and conventional alloys) which will temporarily deform and then spring back to their original shape; or allowing segments of the sheath's sides to telescope within each other or along a track or groove. For a mesh sheath 220, a wire mesh may be made of steel, copper, or a similarly pliable metal which also is electrically conductive so as to provide shielding form electromagnetic radiation. The material may be forged, welded, or soldered such that the intersections are permanently joined together and much of the movement may be effected mainly via compression of the metal. Alternatively, the intersecting strands of the mesh material may be riveted together to form a scissor-like joint on which the intersecting strands may pivot, allowing for use of a thicker or less pliable metal. In this latter configuration, the rivets may be of a sufficiently conductive material so as to not break the continuity of the grid's conductivity.

Figure 5:
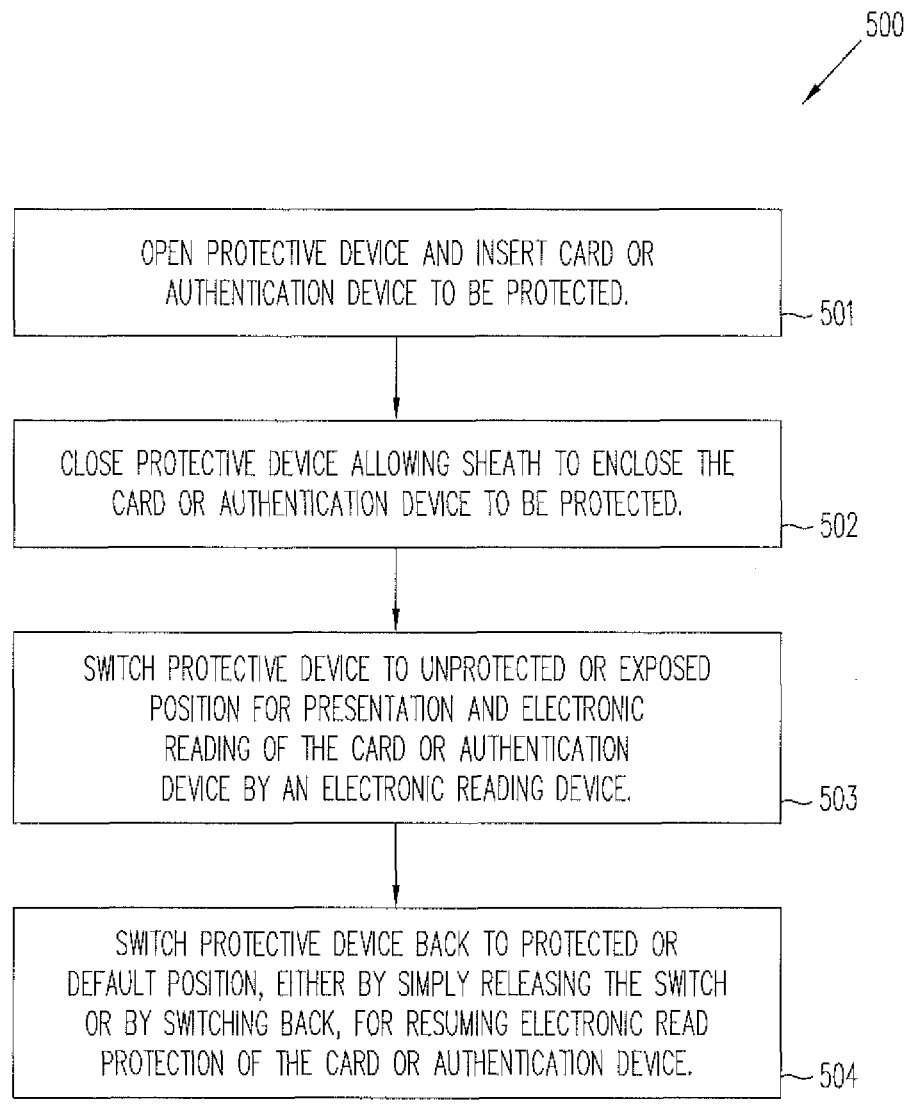
FIG. 5 is a flow chart illustrating a method of providing security for an electronically readable card in accordance with an embodiment.

FIG. 5 illustrates a method 500 of providing security for an electronically readable card in accordance with an embodiment. At step 501, an authentication device 105—such as a credit card, ID badge, passport, or similar item—for which electronic read protection is desired may be inserted into the protective device 200, for example, by inserting authentication device 105 (e.g., an RFID chip embedded card) through opening 212 in case 210 into inner sleeve 224 after sheath 220 has been moved to the second, unprotected, or exposed position (for example, by depressing and holding down button 222) shown in FIG. 2. For example, a user or wearer of protective device 200 may depress a compression switch (e.g., button 222) to draw the sheath 220 down and away from the top slit (e.g., opening 212) of the protective device's inner sleeve 224, as seen in FIG. 2. After opening the protective device 200, the user may insert his or her authentication device 105, e.g., RFID badge, or similar card, into the inner sleeve 224 such that it is entirely covered by the outer plastic cover (e.g., case 210) as seen in FIG. 2.

At step 502, protective device 200 may be closed so that the sheath 220 encloses or surrounds the card or authentication device 105, (so as to effectively form a Faraday cage around the card 105) protecting the card 105 from being electronically read while allowing the device to remain visible enough that visual information on the card 105 can still be discerned or visually read. For example, a user or wearer of protective device 200 may release pressure on a compression switch (e.g., button 222) to allow the sheath 220 to expand and rise to cover the length of the card 105, at its first or default position, as seen in FIG. 3. An opening in the top of the sheath 220 may be closed sufficiently—using bevel features or tensile properties of the material of sheath 220 described above, for example—that electronic read protection for card 105 remains effective at the first or default position of sheath 220.

At step 503, the protective device 200 may be switched to the unprotected or exposed (second) position (shown in FIG. 2) for presentation to an electronic reading device 104 (e.g., a card reader) and electronic reading of the card or authentication device by the electronic reading device 104. For example, when a user or wearer of protective device 200 is presented with a situation in which the card 105 may be used (e.g., for making a credit card payment or passing an ID checkpoint) the user may depress a compression switch (e.g., button 222) for as long as needed for using the card 105 (e.g., long enough to briefly hold the card near a card reader)—which in turn may expose an RFID chip or NFC circuit embedded in card 105 to electromagnetic fields for the duration that the user keeps button 222 depressed (as would be seen in FIG. 2 if the card were already inserted into protective device 200).

At step 504, protective device 200 may be switched back to protected or default position, either by simply releasing the switch (e.g., button 222) or by switching button 222 back (in an embodiment for which the switch has a catch at both first and second positions of sheath 220), for resuming electronic read protection of the card or authentication device.

For example, once a user or wearer of protective device 200 no longer needs to use authentication device 105 for being electronically read, the user may release pressure on the switch (e.g., button 222) returning the sheath-sleeve system (referring to sheath 220 and inner sleeve 224) to an electronically non-readable state (while card 105 may still be visually readable) and shield the card from electromagnetic fields, as seen in FIG. 3.

In an example according to one embodiment, when the user lets go of the compression switch (e.g., button 222), spring pressure (e.g., elasticity of sheath 220 itself or a separate return spring) may cause the metal lattice (e.g., sheath 220) to expand and enclose the card 105, to act as a protective Faraday cage. While the system (e.g., protective device 200) is in this "default" position, the chip of card 105 effectively cannot be scanned or shorted using conventional technology.

In implementation of the various embodiments, embodiments of the invention may comprise a personal computing device, such as a personal computer, laptop, PDA, cellular phone or other personal computing or communication devices. The payment provider system may comprise a network computing device, such as a server or a plurality of servers, computers, or processors, combined to define a computer system or network to provide the payment services provided by a payment provider system.

FIG. 1 illustrates an exemplary embodiment of a network-based system 100 for implementing one or more processes described herein. As shown, network-based system 100 may comprise or implement a plurality of servers or software components, or both, that operate to perform various methodologies in accordance with the described embodiments. Exemplary servers may include, for example, stand-alone and enterprise-class servers operating a server operating system (OS) such as a MICROSOFT® OS, a UNIX® OS, a LINUX® OS, or other suitable server-based OS. It can be appreciated that the servers illustrated in FIG. 1 may be deployed in other ways and that the operations performed or the services provided by such servers may be combined or separated for a given implementation and may be performed by a greater number or fewer number of servers. One or more servers may be operated or maintained by the same or different entities.

In this regard, a computer system may include a bus or other communication mechanism for communicating information, which interconnects subsystems and components, such as a processing component (e.g., processor, micro-controller, digital signal processor (DSP), etc.), a system memory component (e.g., RAM), a static storage component (e.g., ROM), a disk drive component (e.g., magnetic or optical), a network interface component (e.g., modem or Ethernet card), a display component (e.g., CRT or LCD), an input component (e.g., keyboard or keypad), and/or cursor control component (e.g., mouse or trackball). In one embodiment, a disk drive component may comprise a database having one or more disk drive components.

The computer system may perform specific operations by processor and executing one or more sequences of one or more instructions contained in a system memory component. Such instructions may be read into the system memory component from another computer readable medium, such as static storage component or disk drive component. In other embodiments, hard-wired circuitry may be used in place of or in combination with software instructions to implement the invention.

Logic may be encoded in a computer readable and executable medium, which may refer to any medium that participates in providing instructions to the processor for execution. Such a medium may take many forms, including but not limited to, non-volatile media, volatile media, and transmission media. In one embodiment, the computer readable medium is non-transitory. In various implementations, non-volatile media includes optical or magnetic disks, such as disk drive component, volatile media includes dynamic memory, such as system memory component, and transmission media includes coaxial cables, copper wire, and fiber optics, including wires that comprise bus. In one example, transmission media may take the form of acoustic or light waves, such as those generated during radio wave and infrared data communications.

Some common forms of computer readable and executable media include, for example, floppy disk, flexible disk, hard disk, magnetic tape, any other magnetic medium, CD-ROM, any other optical medium, punch cards, paper tape, any other physical medium with patterns of holes, RAM, ROM, E2PROM, FLASH-EPROM, any other memory chip or cartridge, carrier wave, or any other medium from which a computer is adapted to read.

In various embodiments, execution of instruction sequences for practicing the invention may be performed by a computer system. In various other embodiments, a plurality of computer systems coupled by a communication link (e.g., LAN, WLAN, PSTN, or various other wired or wireless networks) may perform instruction sequences to practice the invention in coordination with one another.

Modules described herein can be embodied in one or more computer readable media or be in communication with one or more processors to execute or process the steps described herein.

A computer system may transmit and receive messages, data, information and instructions, including one or more programs (i.e., application code) through a communication link and a communication interface. Received program code may be executed by a processor as received and/or stored in a disk drive component or some other non-volatile storage component for execution.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa—for example, a virtual Secure Element (vSE) implementation or a logical hardware implementation.

Software, in accordance with the present disclosure, such as program code and/or data, may be stored on one or more computer readable and executable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure. Having thus described various example embodiments of the disclosure, persons of ordinary skill in the art will recognize that changes may be made in form and detail without departing from the scope of the invention. Thus, the invention is limited only by the claims.

What is claimed is:

1. A system comprising:
    a case having an opening for inserting an authentication device and an inside shaped to accept the authentication device, wherein the case allows the authentication device to remain visible when the authentication device is inside the case;
    a flexible, electrically conductive sheath inside the case; and
    a sleeve inside the case for holding the authentication device inside the sleeve, wherein:
    the sheath has a first position and a second position, and is readily moveable between the two positions, and
    the sheath surrounds the sleeve so that the sheath remains between the case and sleeve when moving between the first position and the second position,
    wherein:
        in the first position, when the authentication device is inside the case, the electrically conductive sheath encloses the authentication device and the authentication device remains visible through the sheath; and
        in the second position, the sheath does not enclose the authentication device.

2. The system of claim 1, wherein:
    the sheath has a cylindrical axis; and
    the sheath comprises a mesh of electrically conductive material that compresses and expands in an axial direction with respect to the cylindrical axis, expanding axially to move to the first position and compressing axially to move to the second position.

3. The system of claim 1, wherein:
    the sheath returns to the first position unless held at the second position.

4. The system of claim 1, wherein:
    the sheath has an opening through which the authentication device can pass, the opening having two edges that can separate or close together; and
    the edges of the opening of the sheath comprise a sufficiently tensile yet plastic material so that
        the edges of the opening close together after passing over the authentication device when the sheath moves to the first position and so that
        the edges of the opening separate to allow the authentication device to pass through the opening when the sheath moves to the second position.

5. The system of claim 1, further, comprising:
    a sleeve inside the case for holding the authentication device inside the sleeve, wherein the sheath surrounds the sleeve so that the sheath remains between the case and sleeve when moving between the first position and the second position; and wherein:
        the sheath has an opening through which the authentication device can pass, the sheath opening having two edges that can separate or close together; and
        the sleeve has at least one outside edge beveled to guide the sheath edges away from each other as the sheath moves toward the second position sliding over the sleeve.

6. The system of claim 1, wherein:
    the sheath has an opening through which the authentication device can pass, the sheath opening having two edges that can separate or close together; and
    the inside of the case has a bevel feature arranged so as to guide the sheath edges toward each other as the sheath moves toward the first position enclosing the authentication device.

7. The system of claim 1, wherein:
    the sheath has a cylindrical axis;
    the sheath comprises a mesh of electrically conductive material that compresses and expands in an axial direction with respect to the axis, expanding axially to move to the first position and compressing axially to move to the second position; and the sheath compresses and expands by a scissoring action of elements of the mesh.

8. The system of claim 1, wherein:
the sheath has a cylindrical axis;
the sheath comprises a mesh of electrically conductive material that compresses and expands in an axial direction with respect to the axis, expanding axially to move to the first position and compressing axially to move to the second position; and
the sheath compresses and expands by plastic deformation and recovery inherent in a shape memory of the material of the sheath.

9. The system of claim 1, wherein:
the sheath has a cylindrical axis;
the sheath comprises electrically conductive material that compresses and expands in an axial direction with respect to the axis, expanding axially to move to the first position and compressing axially to move to the second position; and
the sheath compresses and expands by telescoping of segments of the sheath.

10. A method comprising:
encasing a chip-embedded card in a case having an opening for insertion and removal of the chip-embedded card, wherein the case allows the chip-embedded card to remain visible when the chip-embedded card is inside the case;
enclosing the chip-embedded card in a flexible, electrically conductive sheath inside the case, the sheath having a first position and a second position, and readily moveable between the two positions;
compressing and expanding a mesh of electrically conductive material comprising the sheath along a cylindrical axis of the sheath, expanding axially to move to the first position and compressing axially to move to the second position, wherein the sheath is in the first position when enclosing the chip-embedded card and the chip-embedded card remains visible through the sheath but not electronically readable through the sheath; and
moving the sheath to the second position in which the sheath does not enclose the chip-embedded card so that the chip-embedded card is electronically readable in the second position.

11. The method of claim 10, further comprising:
holding the chip-embedded card inside a sleeve inside the case; and
surrounding the sleeve with the sheath so that the sheath remains between the case and sleeve when moving between the first position and the second position.

12. The method of claim 10, further comprising:
returning the sheath automatically to the first position unless held at the second position.

13. The method of claim 10, further comprising:
closing together two edges of an opening of the sheath after passing the sheath over the chip-embedded card when the sheath moves to the first position; and
separating the two edges of the opening of the sheath to allow the chip-embedded card to pass through the opening when the sheath moves to the second position.

14. The method of claim 10, further comprising:
holding the chip-embedded card inside a sleeve inside the case;
surrounding the sleeve with the sheath so that the sheath remains between the case and sleeve when moving between the first position and the second position; and
guiding two edges of an opening of the sheath away from each other as the sheath moves toward the second position by sliding over at least one outside beveled edge of the sleeve.

15. The method of claim 10, further comprising:
guiding two edges of an opening of the sheath within a bevel feature of the inside of the case toward each other to close the opening of the sheath as the sheath moves toward the first position enclosing the chip-embedded card.

16. The method of claim 10, further comprising:
compressing and expanding a mesh of electrically conductive material comprising the sheath along a cylindrical axis of the sheath, expanding axially to move to the first position and compressing axially to move to the second position wherein the sheath compresses and expands by elastic deformation and recovery inherent in an elasticity of the material of the sheath.

17. A method comprising:
protecting an electronically readable card from being electronically read while maintaining visual readability of the electronically readable card by enclosing the electronically readable card in a flexible, electrically conductive sheath, the sheath having a first position and a second position, and readily moveable between the two positions by compressing and expanding a mesh of electrically conductive material comprising the sheath along a cylindrical axis of the sheath, expanding axially to move to the first position and compressing axially to move to the second position, wherein the sheath is in the first position when enclosing the electronically readable card and the electronically readable card remains visible through the sheath but not electronically readable through the sheath;
mechanically switching off a protection of the electronically readable card for presentation to an electronic card reader by moving the sheath to the second position in which the chip-embedded card is electronically readable; and
mechanically switching the protection back on by moving the sheath to the first position so that the electronically readable card is protected from being electronically read yet is still visually readable.

18. The method of claim 17, wherein:
the mechanically switching off of protection is accomplished by activating a switch; and
the mechanically switching protection back on is accomplished by releasing the switch so that the protection is normally on.

19. The method of claim 10, further comprising:
compressing and expanding a mesh of electrically conductive material comprising the sheath along a cylindrical axis of the sheath, expanding axially to move to the first position and compressing axially to move to the second position wherein the sheath compresses and expands by a scissoring action of elements of the mesh.

20. The method of claim 10, further comprising:
compressing and expanding a mesh of electrically conductive material comprising the sheath along a cylindrical axis of the sheath, expanding axially to move to the first position and compressing axially to move to the second position wherein the sheath compresses and expands by a telescoping of segments of the sheath.

* * * * *